(12) United States Patent
Qi et al.

(10) Patent No.: US 9,791,495 B2
(45) Date of Patent: Oct. 17, 2017

(54) HIGH IMPEDANCE FAULT LOCATION IN DC DISTRIBUTION SYSTEMS

(71) Applicant: ABB Technology Ltd., Zurich (CH)

(72) Inventors: Li Qi, Cary, NC (US); Xianyong Feng, Cary, NC (US)

(73) Assignee: ABB Schweiz AG, Baden (CH)

( * ) Notice: Subject to any disclaimer, the term of this patent is extended or adjusted under 35 U.S.C. 154(b) by 13 days.

(21) Appl. No.: 14/985,539

(22) Filed: Dec. 31, 2015

(65) Prior Publication Data
US 2017/0192047 A1    Jul. 6, 2017

(51) Int. Cl.
G01R 31/08    (2006.01)

(52) U.S. Cl.
CPC ......... *G01R 31/085* (2013.01); *G01R 31/088* (2013.01)

(58) Field of Classification Search
CPC .............................. G01R 31/085; G01R 31/088
USPC ........... 324/525, 750.01, 376, 509, 523, 536
See application file for complete search history.

(56) References Cited

U.S. PATENT DOCUMENTS

| 4,329,571 A * | 5/1982 | Gerig .................. G06M 1/108 257/E23.179 |
| 4,425,646 A * | 1/1984 | Kinoshita ............. G06F 3/0601 360/51 |
| 4,468,795 A * | 8/1984 | Gerig .................. G06M 1/108 257/E23.179 |
| 5,446,387 A | 8/1995 | Eriksson et al. |
| 6,822,839 B2 * | 11/2004 | Habetler ............... H02H 7/085 324/765.01 |
| 8,355,882 B2 | 1/2013 | Nowicki et al. |
| 2003/0074146 A1 * | 4/2003 | Stoupis ................ G01R 31/024 702/58 |
| 2007/0124093 A1 * | 5/2007 | Choi .................... G01R 31/088 702/59 |
| 2012/0200966 A1 | 8/2012 | Hill et al. |
| 2013/0286521 A1 | 10/2013 | Park |
| 2015/0073735 A1 | 3/2015 | Abido et al. |

* cited by examiner

*Primary Examiner* — Giovanni Astacio-Oquendo
(74) *Attorney, Agent, or Firm* — Taft Stettinius & Hollister LLP (57) ABSTRACT

Unique systems, methods, techniques and apparatuses of fault location in DC power distribution systems are disclosed. One exemplary embodiment is a DC power distribution system comprising at least one DC power distribution network and at least two protective devices operatively coupled to the DC power distribution network. Each protective device is structured to sense one or more electrical characteristics associated with the DC power distribution network and to controllably interrupt current through the DC power distribution line. A control system is structured to determine the location of a high impedance fault between two of the protective devices using one or more electrical characteristics sensed by the two protective devices to calculate the inductance and resistance of the portion of the DC power distribution line between one of the protective devices and the high impedance fault.

23 Claims, 3 Drawing Sheets

HIGH IMPEDANCE FAULT LOCATION IN DC DISTRIBUTION SYSTEMS

BACKGROUND

The present disclosure relates generally to fault location in DC distribution systems, sometimes referred to as DC distribution networks. Improvement in energy and power density of power electronic switches has facilitated development of DC power distribution systems. Present efforts at high impedance fault location in DC power distribution systems suffer from a number of shortcomings and disadvantages. There remain unmet needs respecting identification of fault location, speed of fault protection, comprehensive coverage of protected system zones, reliability, minimization of communication delay, and local measurement of fault conditions and fault characteristics. Further unmet needs include enhancing protection selectivity, minimizing fault affected areas, accurate fault location, reducing equipment cost, reduction of fault currents, reducing post-fault over voltages, and fast fault protection. There is a significant need for the unique apparatuses, methods, systems and techniques disclosed herein.

SUMMARY

Exemplary embodiments include unique fault location systems, methods, techniques and apparatuses for DC power distribution systems. Further embodiments, forms, objects, features, advantages, aspects and benefits of the disclosure shall become apparent from the following description and drawings.

BRIEF DESCRIPTION OF THE DRAWINGS

For the purposes of clearly, concisely and exactly describing non-limiting exemplary embodiments of the disclosure, the manner and process of making and using the same, and to enable the practice, making and use of the same, reference will now be made to certain exemplary embodiments, including those illustrated in the figures, and specific language will be used to describe the same. It shall nevertheless be understood that no limitation of the scope of the present disclosure is thereby created, and that the present disclosure includes and protects such alterations, modifications, and further applications of the exemplary embodiments as would occur to one skilled in the art with the benefit of the present disclosure.

DETAILED DESCRIPTION OF ILLUSTRATIVE EMBODIMENTS

Figure 1:
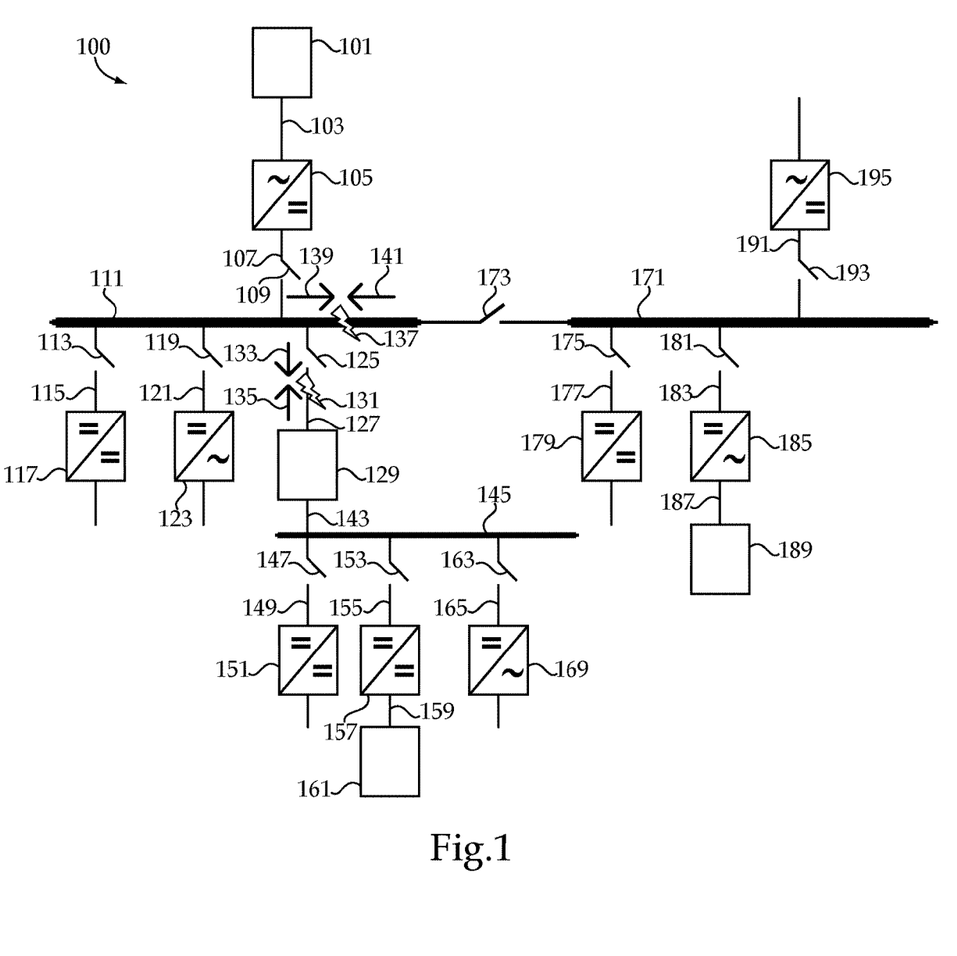
FIG. 1 illustrates an exemplary DC power distribution system.

With reference to FIG. 1 there is illustrated an exemplary DC power distribution system 100. It shall be appreciated that system 100 may be implemented in a variety of applications, including DC distribution networks, DC industrial systems, DC renewable energy collection systems, DC shipboard power systems, DC data centers, and DC building systems to name but a few examples.

System 100 includes power sources 101, 161, 189; AC power distribution line 103; DC power distribution lines 107, 115, 121, 127 143, 149, 155, 159, 165, 177, 183, 187, 191; DC/DC converters 117, 151, 157, and 179; AC/DC converters 105, 123, 169, 185, 195; protective devices 109, 113, 119, 125, 147, 153, 163, 175, 181, 193; DC bus 111, 145, 171; switch 129; and tieline 173.

Power source 101 is coupled to AC power distribution line 103 and is structured to provide AC power to line 103. Power source 101 may be an AC transmission line or may be a device structured to generate AC power such as a gas generator or a wind turbine. Power source 101 may also be structured as a DC power source such as a photovoltaic array which may be coupled to DC power distribution line by a DC/DC converter or by a DC/AC converter coupled to an AC/DC converter by an intermediate AC power line. Power source 101 may include capacitors and inductors structured to discharge during DC faults. It shall be appreciated that any or all of the foregoing features may also be present in the other power sources disclosed herein.

AC/DC converter 105 is coupled to line 103 and is structured to receive AC power from line 103, convert the AC power to DC power, and provide the DC power to line 107 which is coupled to converter 105. In certain embodiments, converter 105 may be additionally structured to receive DC power from line 107, convert the DC power to AC power, and provide the AC power to line 103. It shall be appreciated that any or all of the foregoing features may also be present in the other AC/DC converters disclosed herein.

Line 107 is coupled to DC bus 111. Protective device 109 is coupled to line 107. In the illustrated embodiment, device 109 is a protective device such as a smart circuit breaker structured to controllably interrupt the flow of current through a portion of line 107. In some embodiments, device 109 may be structured as a stand-alone measurement device which is positioned proximate a protective device. Device 109 includes a measurement device structured to sample electrical characteristics of line 107. These electrical characteristics include voltage samples and current samples. The measurement device may be structured to directly measure current values, directly measure rate of change in current values, calculate rate of change in current values using directly measured current values, and/or calculate current values using directly measured rate of change in current values. It shall be appreciated that the current measurements disclosed herein include and encompass all direct measurements of and all calculations of current values and rate of change of current values unless otherwise indicated. Furthermore, the calculated values may be calculated by device 109 or by an electronic control system in operative communication with device 109. It shall be appreciated that any or all of the foregoing features may also be present in the other protective devices disclosed herein.

DC power distribution line 115 is coupled to DC bus 111. Protective device 113 is coupled to line 115. DC/DC converter 117 is coupled to line 115 and is structured to receive DC power with a given voltage value from line 115, convert the DC power to DC power with a different voltage value and provide the converted DC power to a load subsystem (not pictured). Converter 117 may be structured to receive power from a power source (not pictured), convert the DC power to DC power with a different voltage value and provide the converted DC power to, It shall be appreciated that any or all of the foregoing features may also be present in the other DC/DC converters disclosed herein DC power distribution line 121 is coupled to DC bus 111. Protective device 119 is coupled to line 115. AC/DC converter 123 is coupled to line 115 and is structured to receive DC power from line 121, convert the DC power to AC power and provide the AC power to a load (not pictured).

Switch 129 is coupled to DC bus 111 by way of line 127. Protective device 125 is coupled to line 127. Switch 129 is coupled to DC bus 145 by way of line 143. DC/DC converter 151 is coupled to DC bus 145 by way of line 149. Protective device 147 is coupled to line 149. Converter 151 is coupled to a load (not pictured).

DC/DC converter 157 is coupled to DC bus 145 by way of line 155. Protective device 153 is coupled to line 155. Power source 161 is coupled to DC/DC converter by way of distribution line 159. AC/DC converter 169 is coupled to DC bus 145 by way of line 167. Protective device 165 is coupled to line 167. Converter 169 is coupled to a load (not pictured).

DC bus 111 is selectively coupled to DC bus 171 by way of tieline 173. AC/DC converter 195 is coupled to DC bus 171 by way of line 191. Converter 195 is coupled to a distribution system (not pictured). Protective device 193 is coupled to line 191. DC/DC converter 179 is coupled to DC bus 171 by way of line 177. Protective device 175 is coupled to line 177. Converter 179 is coupled to a load subsystem (not pictured). AC/DC converter 185 is coupled to DC bus 171 by way of line 183. Protective device 181 is coupled to line 183. Power source 189 is coupled to AC/DC converter 185 by way of line 187.

As illustrated in FIG. 1, a high impedance fault may occur on line 127 at fault point 131 between protective device 125 and switch 129. Forward fault current 133 is flowing from power source 101 to fault point 131 and reverse fault current 135 is flowing from power source 161 to fault point 131. In some embodiments, multiple power sources may contribute to reverse fault current, in which case reverse current 135 would be the aggregation of the currents flowing from the power sources to fault point 131. Similarly, multiple power sources may contribute to forward fault current, in which case forward fault current 133 would be the aggregation of the currents flowing from multiple power sources coupled to fault point 131. For example, if tieline 173 were closed, forward fault current 133 would be the aggregate of current flowing from power source 101 and power source 189.

Forward fault current 133 or reverse fault current may be calculated by summing the values of current measurements from a plurality of protective devices. For example, reverse fault current 135 is calculated by summing the values of the currents measured by protective devices 147, 153, and 163.

It shall be appreciated that a high impedance fault may occur under a number of circumstances, for example, when current from a power distribution line flows to a ground by way of a non-metallic medium, such as in an arcing fault, or when current flow occurs through intermittent contact between a conductor and ground. A high impedance fault may also occur when current flows from a positive pole power distribution line to a negative pole power distribution line by way of a non-metallic medium. In one example of a high impedance fault is a fault where the resistance of fault impedance exceeds 50 milliohms.

With continuing reference to FIG. 1, a high impedance fault may also occur on DC bus 111 at fault point 137 between the point at which line 127 is coupled to DC bus 111 and tieline 173. A forward fault current 139 is flowing from power sources 101 and 161 to fault point 137 and a reverse fault current 141 is flowing from power source 189 to fault point 137.

Figure 2:
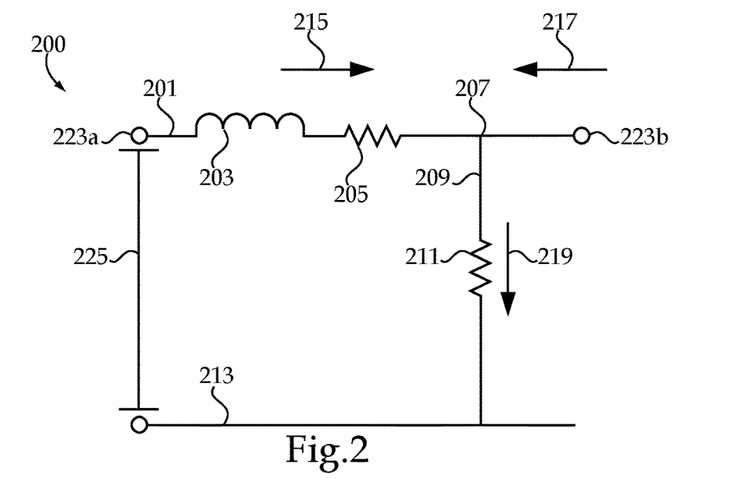
FIG. 2 illustrates an exemplary equivalent circuit between two measurement devices and a high impedance fault.

With reference to FIG. 2 there is illustrated an exemplary equivalent circuit 200 for a power distribution line experiencing a high impedance fault. Circuit 200 includes DC power distribution line 201 having a line inductance 203 and a line resistance 205 between a point 223a of line 201 and fault point 207 of line 201. At fault point 207, line 201 is short circuited to point 213 by way of a fault 209 having a fault resistance 211. Point 213 may comprise a ground or a point on a second power distribution line. For example, line 201 may be structured as a positive pole power distribution line which is short circuited to point 213 on a negative pole power distribution line. Forward fault current 215 flows from point 223a on line 201 to fault point 207 and reverse fault current 217 flows from point 223b to fault point 207. Aggregate fault current 219 is structured to flow from the positive pole of fault point 207 to point 213, the magnitude of the current being the sum of forward fault current 215 and reverse fault current 217. Voltage 225 is the difference in voltage between point 223a and point 213.

The state space equation of equivalent circuit 200 can be expressed as the following formula, where $v_{f1a}$ is voltage 225, $L_1$ is line inductance 203, $di_{f1}/dt$ is the first derivative of current $i_{f1}$ indicating the change in forward fault current 215 with respect to time, $R_1$ is line resistance 205, $R_F$ is fault resistance 211, $i_{f1}$ is the forward fault current 215, and $i_{f2}$ is the reverse fault current 217.

$$v_{f1a}(t) = L_1\frac{di_{f1}(t)}{dt} + R_1 \times i_{f1}(t) + R_F(i_{f1}(t) + i_{f2}(t)) \quad \text{Equation (1)}$$

The values for voltage 225, change in forward fault current 215, forward fault current 215, and reverse fault current 217 are sampled or calculated at separate time instants. The sampling rate is determined according to the time constants of the fault transients and noise in the measurement signals. The sampling rate could be chosen as low as possible according to Nyquist-Shannon Sampling Theorem. For example, if the frequency of a fault transient is 100 Hz, The sampling rate should be twice the frequency of the fault transient, or 200 Hz. Applications of the Nyquist-Shannon Sampling Theorem based upon signal noise may also be utilized.

Line resistance 215, line inductance 217, and fault resistance 219 can be estimated from data sampled during different time instants using regression analysis, such as the least squares method. The following set of equations illustrates the state space equation of equivalent circuit 200 using data for voltage 225, change in forward fault current 215, forward fault current 215, and reverse fault current 217 sampled for time instants 0 through N:

$$v_{f1a}(0) = L_1\frac{di_{f1}(0)}{dt} + R_1 \times i_{f1}(0) + R_F(i_{f1}(0) + i_{f2}(0)) \quad \text{Equation (2)}$$

$$v_{f1a}(1) = L_1\frac{di_{f1}(1)}{dt} + R_1 \times i_{f1}(1) + R_F(i_{f1}(1) + i_{f2}(1))$$

$$\vdots$$

$$v_{f1a}(N) = L_1\frac{di_{f1}(N)}{dt} + R_1 \times i_{f1}(N) + R_F(i_{f1}(N) + i_{f2}(N))$$

In order to perform least squares regression, sampled values for change in forward fault current 215, forward fault current 215, and reverse fault current 217 are combined into an (N+1)×3 matrix, A. The sampled values for voltage are combined into a column vector N+1 values in length, B. Matrix A and vector B are expressed as follows:

$$A = \begin{bmatrix} \frac{di_{f1}(0)}{dt} & i_{f1}(0) & i_{f1}(0)+i_{f2}(0) \\ \frac{di_{f1}(1)}{dt} & i_{f1}(1) & i_{f1}(1)+i_{f2}(1) \\ \vdots & \vdots & \vdots \\ \frac{di_{f1}(N)}{dt} & i_{f1}(N) & i_{f1}(N)+i_{f2}(N) \end{bmatrix} \quad B = \begin{bmatrix} v_{f1a}(0) \\ v_{f1a}(1) \\ \vdots \\ v_{f1a}(N) \end{bmatrix}$$

Using matrix A and vector B, line resistance 215, line inductance 217, and fault resistance 219 are estimated using the following equation:

$$\begin{bmatrix} L \\ R_1 \\ R_F \end{bmatrix} = (A^T A)^{-1} A^T B \quad \text{Equation (3)}$$

At least three samples are required to calculate line resistance 215, line inductance 217, and fault resistance 219 using linear regression. The number of samples used to create matrix A and vector B may be established by the number of samples taken within a time period of detecting the fault. In certain embodiments, an online moving-window least square method is implemented to identify line resistance 215 and line inductance 217 from point 223*a* to fault point 207. The number of samples for the moving-window is defined by the user. It shall be appreciated that the one or more control systems disclosed herein may be configured to perform calculations or determinations in accordance with the foregoing equations and techniques.

In certain embodiments, fault 209 additionally comprises a fault inductance. Equations (1)-(3) and matrix A can be modified to calculate line resistance 215, line inductance 217, fault resistance 219, and fault inductance. A state space equation reflecting fault inductance is expressed as the following formula, where equation (1) is modified to include fault inductance $L_F$:

$$v_{f1a}(t) = L_1 \frac{di_{f1}(t)}{dt} + R_1 \times i_{f1}(t) + \\ R_F(i_{f1}(t)+i_{f2}(t)) + L_F\left(\frac{di_{f1}(t)}{dt} + \frac{di_{f2}(t)}{dt}\right) \quad \text{Equation (4)}$$

The following set of equations illustrates the state space equation (4) using data for voltage 225, change in forward fault current 215, forward fault current 215, and reverse fault current 217 sampled for time instants 0 through N:

$$v_{f1a}(0) = L \frac{di_{f1}(0)}{dt} + R_1 \times i_{f1}(0) + \\ R_F(i_{f1}(0)+i_{f2}(0)) + L_F\left(\frac{di_{f1}(0)}{dt} + \frac{di_{f2}(0)}{dt}\right) \quad \text{Equation (5)}$$

$$v_{f1a}(1) = L \frac{di_{f1}(1)}{dt} + R_1 \times i_{f1}(1) + \\ R_F(i_{f1}(1)+i_{f2}(1)) + L_F\left(\frac{di_{f1}(1)}{dt} + \frac{di_{f2}(1)}{dt}\right)$$

$$\vdots$$

$$v_{f1a}(N) = L \frac{di_{f1}(N)}{dt} + R_1 \times i_{f1}(N) + \\ R_F(i_{f1}(N)+i_{f2}(N)) + L_F\left(\frac{di_{f1}(N)}{dt} + \frac{di_{f2}(N)}{dt}\right)$$

In order to perform least squares regression, sampled values for change in forward fault current 215, forward fault current 215, and reverse fault current 217 are combined into a modified (N+1)×4 matrix, A. The sampled values for voltage are combined into a column vector N+1 values in length, B. Matrix A and vector B are expressed as follows:

$$A = \begin{bmatrix} \frac{di_{f1}(0)}{dt} & i_{f1}(0) & i_{f1}(0)+i_{f2}(0) & \frac{di_{f1}(0)}{dt}+\frac{di_{f2}(0)}{dt} \\ \frac{di_{f1}(1)}{dt} & i_{f1}(1) & i_{f1}(1)+i_{f2}(1) & \frac{di_{f1}(1)}{dt}+\frac{di_{f2}(1)}{dt} \\ \vdots & \vdots & \vdots & \vdots \\ \frac{di_{f1}(N)}{dt} & i_{f1}(N) & i_{f1}(N)+i_{f2}(N) & \frac{di_{f1}(N)}{dt}+\frac{di_{f2}(N)}{dt} \end{bmatrix}$$

$$B = \begin{bmatrix} v_{f1a}(0) \\ v_{f1a}(1) \\ \vdots \\ v_{f1a}(N) \end{bmatrix}$$

Using modified matrix A and vector B, line resistance 215, line inductance 217, fault resistance 219, and fault inductance $L_F$ are estimated using the following equation:

$$\begin{bmatrix} L \\ R_1 \\ R_F \\ L_F \end{bmatrix} = (A^T A)^{-1} A^T B \quad \text{Equation (6)}$$

Figure 3:
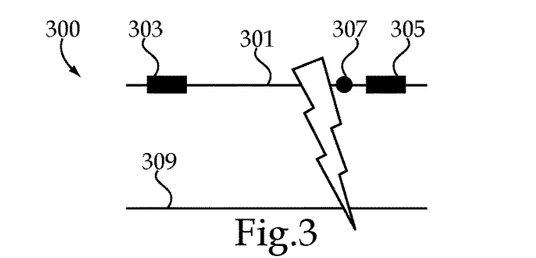
FIG. 3 illustrates a portion of an exemplary DC power distribution system.

With reference to FIG. 3, there is illustrated a portion of another exemplary DC power distribution system 300 which includes DC power distribution line 301, measurement device 303 and measurement device 305. Measurement devices 303 and 305 are operatively coupled to line 301, and each are structured to measure electrical characteristics of line 301 at the point to which the respective device is coupled. Measurement devices 303 and 305 may be structured to evaluate the electrical characteristics of the line 301 to determine the presence of a fault. It shall be appreciated that any or all of the foregoing features may also be present in the other measurement devices disclosed herein.

In certain embodiments, system 300 may additionally comprise a DC bus coupled to line 301 and a second power distribution line coupled to the DC bus wherein measurement device is 305 is coupled to the second power distribution line.

In the illustrated embodiment, a high impedance vault has occurred at point 307 on line 301 between measurement devices 303 and 305, causing the positive pole of point 307 to become short circuited to point 309. Point 309 may be structured as the negative pole of point 307 or a ground.

Figure 4:
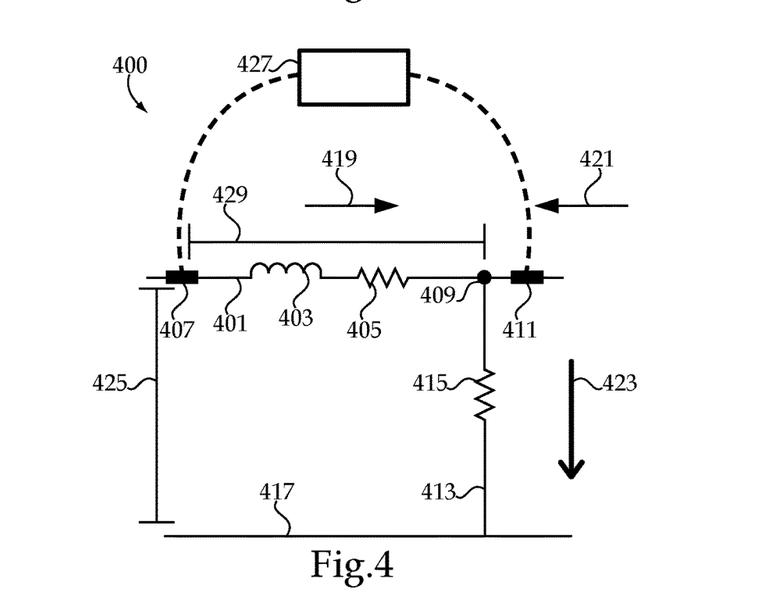
FIG. 4 illustrates an exemplary equivalent circuit of the exemplary DC power distribution system of FIG. 3.

With reference to FIG. 4, there is illustrated an equivalent circuit 400 of the exemplary DC power distribution system 300 in FIG. 3, which is experiencing a high impedance fault. It shall be appreciated that system 400 and the features and components thereof may include any of all of the structural functional features and attributes described above in connection with systems 100 and 300, as well as circuit 200. System 400 includes DC power distribution line 401, measurement device 407, measurement device 411, and control system 427.

Measurement device 407 and measurement device 411 are coupled to line 401 different points on line 401. Measurement device 407 is structured to measure forward fault current 407 and a voltage 425 of line 401 at the point device 407 is coupled to line 401. Measurement device 411 is structured to measure reverse fault current 421. In certain embodiments, system 400 may comprise additional measurement devices coupled to line 401 between measurement devices 407 and 411.

As previously discussed with respect to FIG. 1 above, forward fault current 419 or reverse current 421 may be calculated by summing measurements from a plurality of measurement devices. With respect to FIG. 4, system 400 could additionally comprise another measurement device coupled to a line coupled to line 401, the new line being structured to provide power to line 401 or receive power from line 401. If the new line was coupled to the portion of line 401 where forward fault current 419 flowed to fault point 409, forward current 419 would be calculated by summing the current measurements taken by measurement device 407 and the new measurement device. Similarly, if the new line was coupled to the portion of line 401 where reverse fault current 421 flowed to fault point 409, reverse current 421 would be calculated by summing the current measurements taken by measurement device 411 and the new measurement device. The measurement devices used to measure or calculate forward fault current or reverse fault current need not be the closest measurement devices to the fault point 409. Where multiple measurement devices are used to calculate forward fault current 419, voltage 425 is the local voltage measured by the measurement devices measuring a portion of forward fault current 419.

Between devices 407 and 411, a high impedance fault 413 is occurring at fault point 409, an unknown distance 429 from device 407. The portion of line 401 between device 407 and fault point 409 has a line inductance 403 and a line resistance 405. At fault point 409, line 401 is short circuited to point 417 by way of fault 413 having a fault resistance 415. In certain embodiments, point 417 may be structured as the negative pole of point 409 or a ground. A forward fault current 419 from a first power source (not pictured) is flowing along line 401 to fault point 409 through measurement device 407. A reverse fault current 421 from a second power source (not pictured) is flowing along line 401 to fault point 409 through measurement device 411. It shall be appreciated that the portion of line 401 between measurement device 411 and fault point 409 includes a line inductance and a line resistance element; however, these values are may be omitted from the equivalent circuit because they are not required to calculate the location of the fault. An aggregate fault current 423 is flowing from fault point 409 to point 417.

Control system 427 is structured to receive measurements from devices 407 and 409. System 427 may be structured to use the measurements received from devices 407 and 409 to determine whether a fault is present on line 401 or system 427 may receive a fault notification signal from an external device, such as one of the measurement devices 407 and 409. System 427 is additionally structured to execute the following stored program instructions in response to detecting the existence of a non-metallic fault: receive a plurality of measurements from the first measurement device, each comprising a voltage measurement and at least one forward fault current measurement, receive a plurality of measurements from the second measurement device, each comprising a reverse current measurement, determine an inductance of the first portion of the DC power distribution system, a resistance of the first portion of the DC power distribution system, and a resistance of the fault using the plurality of measurements from both the first measurement device and the second measurement device, and identify a physical location of the fault in the DC power distribution system using at least one of the inductance of the first portion and the resistance of the first portion.

In certain embodiments, the physical location of the fault may be any point between measurement devices 407 and 409, including a second power distribution line or a DC bus. In other embodiments in which system 400 include smart circuit breakers, system 427 may be additionally structured to execute a program instruction to transmit a trip signal to at least one of the smart circuit breakers in response to determine that the location of the fault within the protection zone of the smart circuit breaker. System 427 may request the plurality of measurements from each of the measurement devices before receiving the plurality of measurements from each of the measurement devices. Control system 427 may comprise a plurality of control systems, each control system being associated with a respective measurement device or protective device.

Figure 5:
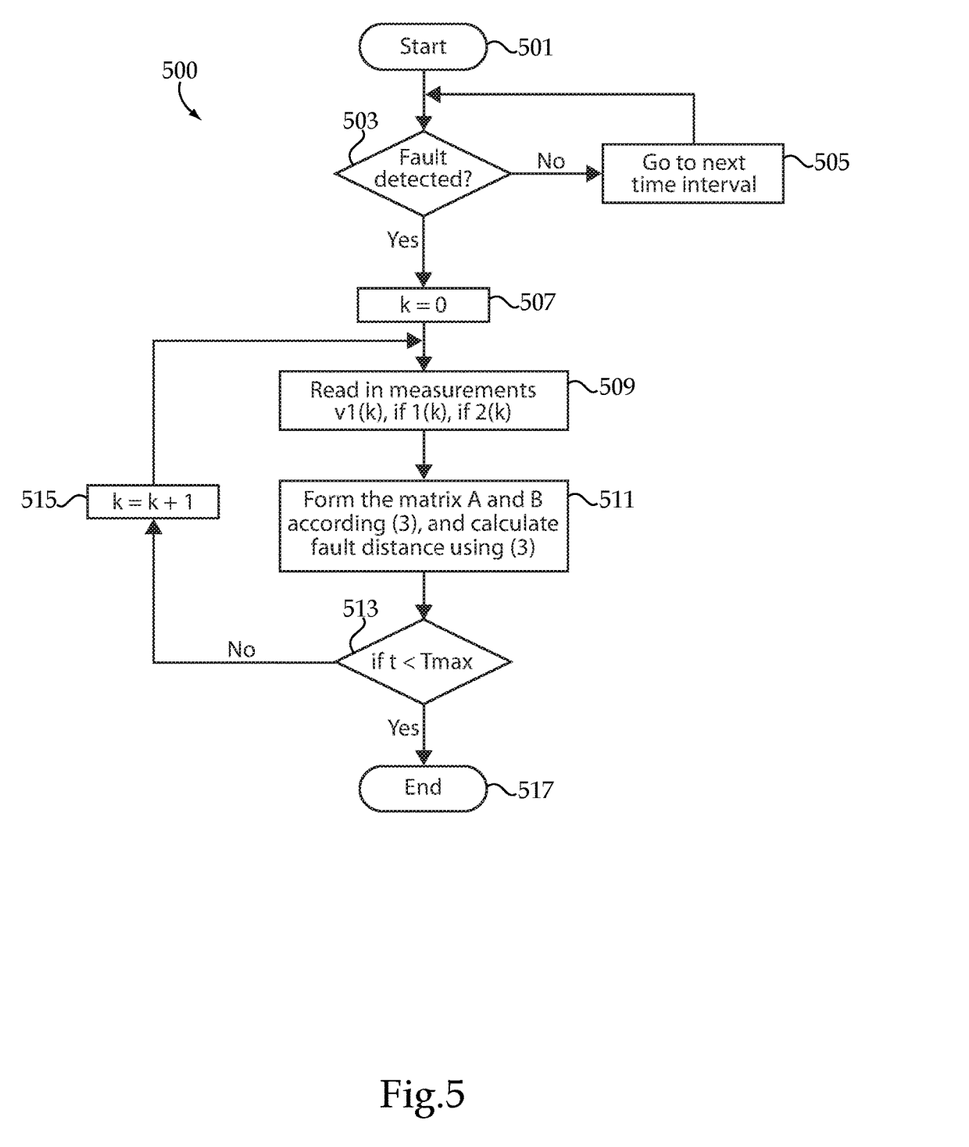
FIG. 5 illustrates an exemplary fault location determination process.

With reference to FIG. 5, there is illustrated an exemplary process 500 for determining a location of a high impedance fault. Process 500 may be implemented in whole or in part in one or more of the control systems disclosed herein. In certain forms the fault detection and fault location functionalities may be performed by separate control systems. In certain forms both functionalities may be performed by the same control system. Furthermore, as noted above, the control systems disclosed herein may be dedicated to a respective local protective device or may be structured to serve multiple local protective devices.

Process 500 begins at start operation 501 and proceeds to conditional 503 which evaluates whether a fault is present. Conditional 503 may perform this evaluation using a variety of techniques such as a limit, threshold or trigger point established for line-to-line or line-to-ground voltage, line current or line current time rate of change. If a fault is not detected, process 500 proceeds to operation 505 which causes process 500 to proceed to the next time interval and then return to conditional 503. If conditional 503 detects a fault condition, process 500 proceeds to operation 507 where a time interval counter k is set to zero.

From operation 507, process 500 proceeds to operation 509 where a first measurement device measures a forward fault current flowing in a first portion of the DC power distribution system through the measurement device. The first measurement device also measures the voltage across the first portion of the DC power distribution system. Operation 509 includes a second measuring device measuring a reverse fault current flowing in a second portion of the DC power distribution system through the second measurement device.

From operation 509, process 500 proceeds to operation 511 where matrix A and vector B above are determined by adding voltage samples to B and current samples to A. If matrix A and vector B each contain at least three samples, Equation (3) from above is used to determine a value of the line inductance and a value of the resistance between the first measurement device and the fault, as well as a value of the fault resistance. The calculated line inductance and line resistance are compared to known line inductance and line resistance values of the DC power distribution system in order to estimate the distance between the first measurement device and the fault. For purposes of illustration, if the line resistance of a line between the two measuring devices is 10 ohm, and the calculated line resistance between one measuring device and the fault point is 5 ohm, the fault point is located halfway between the two measuring devices, Process 500 advances to conditional 513 where the time duration of the process 500 beginning at operation 509 is compared to a user defined value Tmax. If the time duration is less than Tmax, process 500 advances to operation 515 where the time interval counter value k is incremented by one before the logic advances to operation 509. If the time duration is not less than Tmax, the logic advances to end operation 517 which may terminate process 500 allowing for it to be re-initiated at a later time.

Process 500 may be implemented in one or more control systems such as those disclosed herein. In certain embodiments a plurality of control systems each corresponding to a particular measurement device may execute process 500 at a separation location. In certain embodiments one or more central or clustered control systems may execute process 500 at one location. It shall be further appreciated that a number of variations and modifications to process 500 are contemplated including, for example, the omission of one or more aspects of process 500, the modification of the inductance calculation mathematics, the addition of further conditionals and operations and/or the reorganization or separation of operations and conditionals into separate processes. Further written description of a number of exemplary embodiments shall now be provided. One embodiment is a method of locating a high impedance fault in a DC power distribution system, the method comprising: identifying a fault condition of the DC power distribution system; measuring a forward fault current flowing in a first portion of the DC power distribution system from a first node to the fault, a reverse fault current flowing in a second portion of the DC power distribution system from a second node to the fault, and a voltage across the first portion of the DC power distribution system at the first node; determining an inductance of the first portion of the DC power distribution system, a resistance of the first portion of the DC power distribution system, and a resistance of the fault using the forward fault current, the reverse fault current and the voltage; and identifying a physical location of the fault in the DC power distribution system using at least one of the inductance of the first portion and the resistance of the first portion.

In certain forms of the foregoing method, the act of measuring comprises making a plurality of measurements comprising at least three measurements of forward fault current, reverse fault current and voltage across the first portion, and wherein the plurality of measurements is used in determining the inductance of the first portion, the resistance of the first portion, and the resistance of the fault. In certain forms, the act of determining comprises determining a matrix A using the at least three measurements of forward fault current and reverse fault current, determining an array B using the least three measurements of voltage across the first portion, and determining an array C including the inductance of the first portion, the resistance of the first portion, and the resistance of the fault using the matrix A and the array B. In certain forms, the array C is determined by calculating $C=(A^TA)^{-1}A^TB$. In certain forms, the act of identifying a physical location utilizes a predetermined relationship between the physical location and one of the inductance of the first portion or the resistance of the first portion. In certain forms, the predetermined relationship comprises one of a line resistance per unit distance and a line inductance per unit distance. In certain forms, the reverse fault current is determined using currents in a plurality of branches of the second portion of the DC power distribution system.

Another exemplary embodiment is a DC power distribution system comprising: a DC power distribution network; a plurality of measurement devices operatively coupled to the DC power distribution network at a plurality of spaced apart locations; an electronic control system structured to execute program instructions stored in a non-transitory memory medium during a high impedance fault condition of the DC power distribution system to: receive a plurality of first measurements from a first one of the measurement devices, each of the first measurements comprising a voltage measurement and a forward fault current measurement, receive a plurality of second measurements from a second one of the measurement devices, each of the second measurements comprising a reverse current measurement, determine an inductance of a first portion of the DC power distribution system extending between the first measurement device and the high impedance fault, a resistance of the first portion of the DC power distribution system, and a resistance of the fault using the plurality of first measurements and the plurality of second measurements, and identify a physical location of the fault in the DC power distribution system using at least one of the inductance of the first portion and the resistance of the first portion.

In certain forms of the foregoing system, the plurality of measurement devices comprise smart circuit breakers. In certain forms, the plurality of measurement devices comprise sensors positioned proximate respective protective devices. In certain forms, the forward fault current measurement and the reverse fault current measurement comprise direct measurements of current, and a time rate of change of the forward fault current is calculated from a plurality of forward fault current measurements. In certain forms, the measurement devices are configured to perform their respective plurality of measurements at a sampling rate selected using at least one of a fault transient time constant and a measurement signal noise value. In certain forms, least squares regression is used to calculate the inductance of the first portion of the DC power distribution system, a resistance of the first portion of the DC power distribution system, and a resistance of the fault. In certain forms, the first measuring device and the second measuring device comprise smart circuit breakers structured to controllably interrupt current through a portion of the coupled power distribution line. In certain forms, the electronic control system is structured to transmit a trip signal to at least one of the smart circuit breakers in response to determining that the location of the fault is within the protection zone of the smart circuit breaker.

A further exemplary embodiment is a DC power distribution system comprising: at least one DC power distribution line; at least two power sources coupled to the DC power distribution line and structured to provide DC power to the DC power distribution line; at least two protective devices operatively coupled to the DC power distribution line between the two power sources, each protective device structured to sense one or more electrical characteristics associated with the DC power distribution line and to controllably interrupt current through the DC power distribution line; and a control system structured to determine the location of a high impedance fault between two of the protective devices using one or more electrical characteristics sensed by each of the two protective devices to calculate inductance and resistance of a portion of the DC power distribution line between one of the protective devices and the high impedance fault.

In certain forms of the foregoing system, the control system is structured to calculate the impedance of the DC power distribution line between one of the protective devices and the high impedance fault by performing linear regression analysis using a plurality of samples of electrical characteristics sensed by the two protective devices. In certain forms, the one or more electrical characteristics sensed by the two protective devices comprise at least one of voltage measurement and current measurement. In certain forms, the samples of electrical characteristics are sensed by the two protective devices in response to determining a fault has occurred within the DC power distribution line. In certain forms, the control system is structured to request the samples from the two protective devices. In certain forms, the system additionally comprises a plurality of control systems, each associated with a respective protective device. In certain forms, the DC power distribution system comprises a plurality of DC power distribution lines, each line operatively coupled to at least one other DC power distribution line by way of a DC bus. In certain forms, the system comprises more than two protective devices wherein the control system is structured to determine the location of a high impedance fault between two of the protective devices using one or more electrical characteristics sensed by each of at least three protective devices to calculate inductance and resistance of a portion of the DC power distribution line between one of the protective devices and the high impedance fault.

While the present disclosure has been illustrated and described in detail in the drawings and foregoing description, the same is to be considered as illustrative and not restrictive in character, it being understood that only certain exemplary embodiments have been shown and described and that all changes and modifications that come within the spirit of the present disclosure are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the present disclosure, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

What is claimed is:

1. A method of locating a high impedance fault in a DC power distribution system, the method comprising:
   operating a plurality of measurement devices operatively coupled to the DC power distribution system;
   operating a DC power distribution system controller operatively coupled to the plurality of measurement devices;
   identifying, with the DC power distribution system controller, a fault condition of the DC power distribution system;
   measuring, with the plurality of measurement devices, a forward fault current flowing in a first portion of the DC power distribution system from a first node to the fault, a reverse fault current flowing in a second portion of the DC power distribution system from a second node to the fault, and a voltage across the first portion of the DC power distribution system at the first node;
   determining, with the DC power distribution system controller, an inductance of the first portion of the DC power distribution system, a resistance of the first portion of the DC power distribution system, and a resistance of the fault using the forward fault current, the reverse fault current and the voltage; and
   identifying, with the DC power distribution system controller, a physical location of the fault in the DC power distribution system using at least one of the inductance of the first portion and the resistance of the first portion.

2. The method of claim 1 wherein the act of measuring comprises making a plurality of measurements comprising at least three measurements of forward fault current, reverse fault current and voltage across the first portion, and wherein the plurality of measurements is used in determining the inductance of the first portion, the resistance of the first portion, and the resistance of the fault.

3. The method of claim 2 wherein the act of determining comprises determining a matrix A using the at least three measurements of forward fault current and reverse fault current, determining an array B using the least three measurements of voltage across the first portion, and determining an array C including the inductance of the first portion, the resistance of the first portion, and the resistance of the fault using the matrix A and the array B.

4. The method of claim 3 wherein the array C is determined by calculating $$C=(A^TA)^{-1}A^TB.$$

5. The method of claim 1 wherein the act of identifying a physical location utilizes a predetermined relationship between the physical location and one of the inductance of the first portion or the resistance of the first portion.

6. The method of claim 5 wherein the predetermined relationship comprises one of a line resistance per unit distance and a line inductance per unit distance.

7. The method of claim 1 wherein the reverse fault current is determined using currents in a plurality of branches of the second portion of the DC power distribution system.

8. A DC power distribution system comprising:
   a DC power distribution network;
   a plurality of measurement devices operatively coupled to the DC power distribution network at a plurality of spaced apart locations;
   an electronic control system structured to execute program instructions stored in a non-transitory memory medium during a high impedance fault condition of the DC power distribution system to:
   receive a plurality of first measurements from a first one of the measurement devices, each of the first measurements comprising a voltage measurement and a forward fault current measurement,
   receive a plurality of second measurements from a second one of the measurement devices, each of the second measurements comprising a reverse current measurement,
   determine an inductance of a first portion of the DC power distribution system extending between the first measurement device and the high impedance fault, a resistance of the first portion of the DC power distribution system, and a resistance of the fault using the plurality of first measurements and the plurality of second measurements, and identify a physical location of the fault in the DC power distribution system using at least one of the inductance of the first portion and the resistance of the first portion.

9. The system of claim 8 wherein the plurality of measurement devices comprise smart circuit breakers.

10. The system of claim 8 wherein the plurality of measurement devices comprise sensors positioned proximate respective protective devices.

11. The system of claim 8 wherein the forward fault current measurement and the reverse fault current measurement comprise direct measurements of current, and a time rate of change of the forward fault current is calculated from a plurality of forward fault current measurements.

12. The system of claim 8 wherein the measurement devices are configured to perform their respective plurality of measurements at a sampling rate selected using at least one of a fault transient time constant and a measurement signal noise value.

13. The system of claim 8 wherein least squares regression is used to calculate the inductance of the first portion of the DC power distribution system, a resistance of the first portion of the DC power distribution system, and a resistance of the fault.

14. The system of claim 8 wherein the first measuring device and the second measuring device comprise smart circuit breakers structured to controllably interrupt current through a portion of the coupled power distribution line.

15. The system of claim 14 wherein the electronic control system is structured to transmit a trip signal to at least one of the smart circuit breakers in response to determining that the location of the fault is within the protection zone of the smart circuit breaker.

16. A DC power distribution system comprising:
at least one DC power distribution line;
at least two power sources coupled to the DC power distribution line and structured to provide DC power to the DC power distribution line;
at least two smart circuit breakers operatively coupled to the DC power distribution line between the two power sources, each of the smart circuit breakers structured to sense one or more electrical characteristics associated with the DC power distribution line and to controllably interrupt current through the DC power distribution line; and a control system structured to determine the location of a high impedance fault between two of the smart circuit breakers devices using one or more electrical characteristics sensed by each of the two smart circuit breakers to calculate inductance and resistance of a portion of the DC power distribution line between one of the smart circuit breakers and the high impedance fault.

17. The system of claim 16 wherein the control system is structured to calculate the impedance of the DC power distribution line between one of the smart circuit breakers and the high impedance fault by performing linear regression analysis using a plurality of samples of electrical characteristics sensed by the two smart circuit breakers.

18. The system of claim 17 wherein the one or more electrical characteristics sensed by the two smart circuit breakers comprise at least one of voltage measurement and current measurement.

19. The system of claim 17 wherein the samples of electrical characteristics are sensed by the two smart circuit breakers in response to determining a fault has occurred within the DC power distribution line.

20. The system of claim 19 wherein the control system is structured to request the samples from the two smart circuit breakers.

21. The system of claim 16 additionally comprising a plurality of control systems, each associated with a respective one of the smart circuit breakers.

22. The system of claim 16 wherein the DC power distribution system comprises a plurality of DC power distribution lines, each line operatively coupled to at least one other DC power distribution line by way of a DC bus.

23. The system of claim 16 comprising more than two smart circuit breakers wherein the control system is structured to determine the location of a high impedance fault between two of the smart circuit breakers using one or more electrical characteristics sensed by each of at least three smart circuit breakers to calculate inductance and resistance of a portion of the DC power distribution line between one of the smart circuit breakers and the high impedance fault.

* * * * *